(12) United States Patent
Song

(10) Patent No.: US 9,779,834 B2
(45) Date of Patent: Oct. 3, 2017

(54) MEMORY SYSTEM FOR IMPROVING PROGRAMMING OPERATION ON FUSE ARRAY

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/184,762

(22) Filed: Jun. 16, 2016

(65) Prior Publication Data

US 2016/0293267 A1    Oct. 6, 2016

Related U.S. Application Data

(62) Division of application No. 14/491,754, filed on Sep. 19, 2014, now Pat. No. 9,396,809.

(30) Foreign Application Priority Data

Mar. 7, 2014    (KR) ........................ 10-2014-0027220

(51) Int. Cl.
*G11C 17/00*    (2006.01)
*G11C 17/16*    (2006.01)
*G11C 17/18*    (2006.01)
*G06F 13/16*    (2006.01)
*G11C 11/406*    (2006.01)
*G11C 29/00*    (2006.01)

(52) U.S. Cl.
CPC .......... *G11C 17/16* (2013.01); *G06F 13/1636* (2013.01); *G11C 11/40611* (2013.01); *G11C 17/18* (2013.01); *G11C 29/78* (2013.01); *G11C 29/783* (2013.01)

(58) Field of Classification Search
CPC .......................... G11C 17/16; G11C 11/40611
USPC .................................................. 365/96, 222
See application file for complete search history.

(56) References Cited

U.S. PATENT DOCUMENTS

2002/0191467 A1*  12/2002  Matsumoto ........... G11C 11/406
                                                                    365/222
2013/0227344 A1*   8/2013  Sohn ....................... G06F 11/27
                                                                    714/6.21

* cited by examiner

*Primary Examiner* — Hoai V Ho
(74) *Attorney, Agent, or Firm* — IP & T Group LLP

(57) ABSTRACT

A semiconductor memory device includes a command buffering unit suitable for receiving and buffering a command signal based on an enable control signal, a fuse array suitable for programming data based on the command signal, and an enable control unit suitable for generating the enable control signal, wherein an activation operation on the command buffering unit by the enable control signal is controlled during a programming operation period of the fuse array.

9 Claims, 4 Drawing Sheets

MEMORY SYSTEM FOR IMPROVING PROGRAMMING OPERATION ON FUSE ARRAY

CROSS-REFERENCE TO RELATED APPLICATIONS

This application is a division of U.S. patent application Ser. No. 14/491,754 filed on Sep. 19, 2014, which claims priority of Korean Patent Application No. 10-2014-0027220, and filed on Mar. 7, 2014. The disclosure of each of the foregoing applications is incorporated herein by reference in its entirety.

BACKGROUND

1. Field

Various embodiments of the present invention relate to a semiconductor memory device including a fuse array circuit.

2. Description of the Related Art

In general, semiconductor memory devices, such as a double data rate synchronous dynamic random access memory (DDR SDRAM), include a fuse circuit for storing setting codes and repair target addresses. An operation for storing data in a fuse circuit is referred to as a programming operation. The programming operation is classified into a physical process and an electrical process.

In the physical process, a fuse is programmed by laser blowing selectively performed according to the data to be stored therein. A fuse used in the physical process is referred to as a physical type fuse. Moreover, since the fuse is cut by using a laser beam, the physical type fuse may be referred to as a laser blowing type fuse. A programming operation on the physical type fuse may be performed in a wafer state in which a semiconductor memory device is not packaged. However, the programming operation on the physical type fuse may not be performed after the semiconductor memory device is packaged.

In the electrical process, a fuse is programmed by using a high voltage application selectively performed according to the data to be stored therein. A fuse used in the electrical process is referred to as an electrical type fuse. The electrical type fuse may change an open state into a short state. The electrical type fuse may be programmed even after a semiconductor memory device is packaged.

New designs for a semiconductor memory device that perform more functions are being developed. However, as the number of operations of the semiconductor memory device is increased, the number of fuses included therein increases considerably. Thus, a technique for efficiently controlling plurality of fuses is needed.

SUMMARY

Various embodiments of the present invention are directed to a semiconductor memory device that may stably perform a programming operation on a fuse array, and a memory system including the same.

In accordance with an embodiment of the present invention, a semiconductor memory device may include a command buffering unit suitable for receiving and buffering a command signal based on an enable control signal; a fuse array suitable for programming data based on the command signal; and an enable control unit suitable for generating the enable control signal, wherein an activation operation on the command buffering unit by the enable control signal is controlled during a programming operation period of the fuse array.

In accordance with an embodiment of the present invention, a semiconductor memory device may include a memory cell array including a normal memory cell and a redundancy memory cell; a fuse array suitable for programming a repair target address, which is used for replacing the normal memory cell with the redundancy memory cell; an enable control unit suitable for generating an enable control signal activated during a programming operation period of the fuse array; and a command buffering unit suitable for receiving and buffering a command signal based on the enable control signal.

In accordance with an embodiment of the present invention, a memory system may include a semiconductor memory device suitable for programming predetermined data on a fuse array during a programming operation period, and accessing the programmed data during a normal operation; and a controller suitable for receiving information corresponding to the programming operation period, and generating a command signal for the semiconductor memory device based on the information.

In accordance with an embodiment of the present invention, a memory system may include a controller suitable for transferring a command signal through a common transmission line; and a plurality of semiconductor memory devices suitable for receiving the command signal, performing an operation corresponding to the command signal, programming predetermined data on a fuse array during a programming operation period, and accessing a programmed data during a normal operation, wherein, when the programming operation is performed on at least one of the semiconductor memory devices, an input operation of the command signal is limited on the at least one of the semiconductor memory devices.

DETAILED DESCRIPTION

Figure 1:
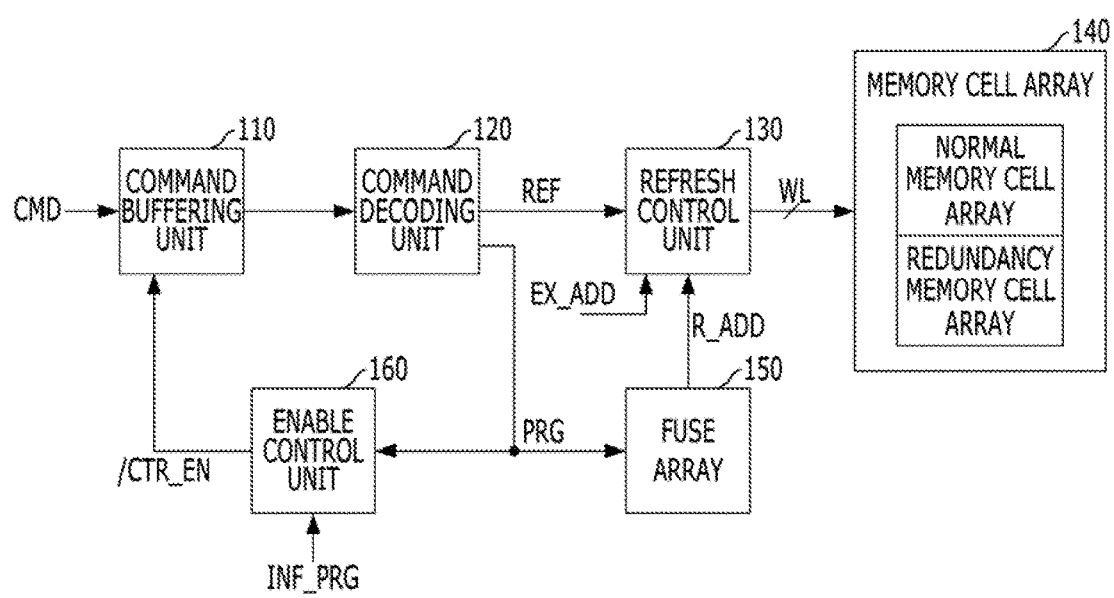
FIG. 1 is a block diagram illustrating a semiconductor memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and, in some instances, proportions may have been exaggerated to clearly illustrate features of the embodiments. In this specification specific terms have been used. The terms are used to describe the present invention, and are not used to qualify the sense or limit the scope of the present invention.

It is also noted that in this specification, "and/or" represents that one or more of components arranged before and after "and/or" is included. Furthermore, "connected/coupled" refers to one component not only directly coupling another component but also indirectly coupling another component through an intermediate component. In addition, a singular form may include a plural form as long as it is not specifically mentioned in a sentence. Furthermore, "include/comprise" or "including/comprising" used in the specification represents that one or more components, steps, operations, and elements exist or are added.

FIG. 1 is a block diagram illustrating a semiconductor memory device in accordance with an embodiment of the present invention.

Referring to FIG. 1, the semiconductor memory device may include a command buffering unit 110, a command decoding unit 120, a refresh control unit 130, a memory cell array 140, a fuse array 150 and an enable control unit 160.

The command buffering unit 110 receives and buffers a command signal CMD in response to an enable control signal /CTR_EN. The command decoding unit 120 decodes an output signal of the command buffering unit 110 to generate an internal command signal. The internal command signal may be a refresh signal REF for a refresh operation, or a programming signal PRG for a programming operation. Moreover, the internal command signal may be a signal for an active operation, a read operation or a write operation.

The refresh control unit 130 performs a refresh operation based on the refresh signal PRG outputted from the command decoding unit 120. The refresh control unit 130 controls the refresh operation by activating a word line WL based on a repair target address R_ADD and an address signal EX_ADD.

The memory cell array 140 includes a plurality of memory cells for storing data. The memory cell array 140 may include a normal memory cell array and a redundancy memory cell array. The normal memory cell array includes a group of normal memory cells for storing the data. The redundancy memory cell array includes a group of redundancy memory cells, which are used for replacing repair target memory cells to be repaired. Word lines WL are coupled to the normal memory cell array and the redundancy memory cell, respectively. Thus, a refresh operation on the memory cell array 140 may be performed under the control of the refresh control unit 130. Although it is not shown in FIG. 1, the word lines WL may be controlled by an active control unit operated based on an active signal.

The fuse array 150 performs a programming operation in response to a programming signal PRG. Various data values may be programmed on the fuse array 150. For example, a setting code, which is preset through a test and an address of the repair target memory cell may be programmed therein.

The enable control unit 160 generates an enable control signal/CTR_EN based on the programming signal PRG. Herein, an activation width of the enable control signal /CTR_EN is adjusted according to programming period information INF_PRG corresponding to a programming operation period of the fuse array 150.

If the enable control signal /CTR_EN is not used, the command signal CMD may be provided to the command decoding unit 120 without the control operation of the enable control unit 160. Since the programming operation of the fuse array 150 is not completed, when the refresh signal REF corresponding to the repair target address R_ADD is inputted while the repair target address R_ADD is programmed, it may be difficult to access the repair target address correctly. Thus, the refresh operation for repair target address may fail.

Alternately, in the semiconductor memory device shown in FIG. 1, since the enable control signal /CTR_EN controls an input of the command signal CMD corresponding to the refresh signal REF, the refresh operation is not performed during the programming operation period, and thus the above-described concern does not occur. Although the command signal CMD corresponding to the refresh signal REF is not received during the programming operation in above-mentioned embodiment of the present invention, in another embodiment, the command signal CMD corresponding to overall operation for accessing data which is programmed on the fuse array 150, may be controlled.

That is, the fuse array 150 activates the enable control signal /GTR_EN during the programming operation period, and blocks the command signal inputted to the command buffering unit 110 in response to the enable control signal /CTR_EN.

Figure 2:
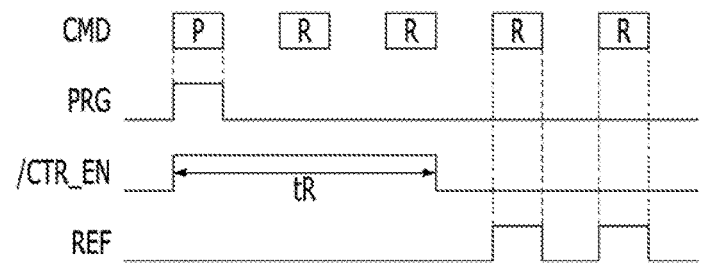
FIG. 2 is a timing diagram for describing an operation of the semiconductor memory device shown in FIG. 1.

FIG. 2 is a timing diagram for describing an operation of the semiconductor memory device shown in FIG. 1. The command signal CMD, the programming signal PRG, the enable control signal /CTR_EN and the refresh signal REF are shown in FIG. 2.

Referring to FIGS. 1 and 2, if a programming operation "P" is performed based on the command signal CMD, the programming signal PRG is activated, and the fuse array 150 performs the programming operation. The programming operation period is defined as "tR", and the activation width of the enable control signal /CTR_EN is defined as "tR" in FIG. 2. The activation width of the enable control signal /CTR_EN may be adjusted by the programming period information INF_PRG.

Moreover, an input operation of the command buffering unit 110 is enabled during the period of the enable control signal /CTR_EN having a logic low value, and the input operation of the command buffering unit 110 is disabled during the period of the enable control signal /CTR_EN having a logic high value. Thus, although the refresh operation "R" is performed based on the command signal CMD during the activated period of the enable control signal /CTR_EN having the logic high value, the refresh signal REF is not activated, and when the enable control signal /CTR_EN has the logic low value, the refresh operation "R" is performed according to the refresh signal REF.

The semiconductor memory device in accordance with the embodiment of the present invention may prevent a refresh operation corresponding to the repair target address from being performed by controlling the activation operation of the command buffering unit 110 during the programming period of the fuse array 150.

Figure 3:
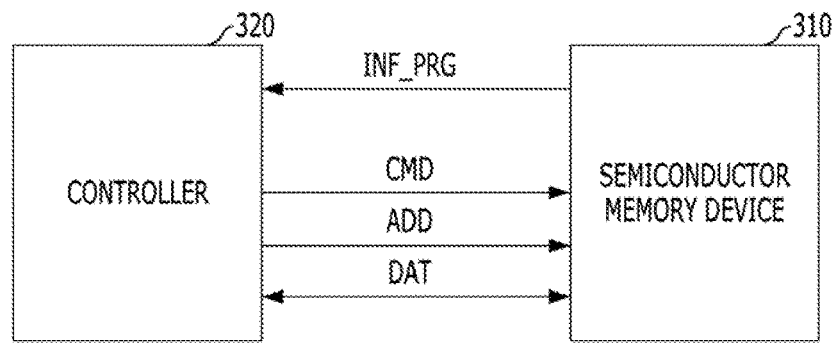
FIG. 3 is a block diagram illustrating a memory system in accordance with an embodiment of the present invention.

FIG. 3 is a block diagram illustrating a memory system in accordance with an embodiment of the present invention.

Referring to FIG. 3, the memory system may include a semiconductor memory device 310 and a controller 320. For convenience, the semiconductor memory device 310 includes the configurations of the semiconductor memory device shown in FIG. 1.

The semiconductor memory device 310 includes the fuse array 150 and performs a programming of data on the fuse array during the programming operation period. The programmed data is accessed during a normal operation and is used for the performance of various operations.

The controller 320 generates various command signal signals CMD for controlling the semiconductor memory device 310. For example, the semiconductor memory device 310 may perform a write operation and a read operation in response to the command signal CMD generated from the controller 320. The semiconductor memory device 310 may store data on a memory cell corresponding to an address ADD during the write operation, and output the data stored on the memory cell corresponding to the address during the read operation. The controller 320 may generate two type command signals CMD according to the programming period information INF_PRG, which is transferred from the semiconductor memory device 310.

Figure 4:
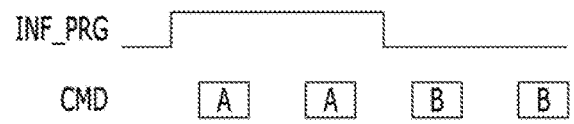
FIG. 4 is a timing diagram for describing an operation of the memory system shown in FIG. 3.

FIG. 4 is a timing diagram for describing an operation of the memory system shown in FIG. 3. The programming period information INF_PRG and the command signals CMD are shown in FIG. 4.

Referring to FIGS. 3 and 4, the programming period information INF_PRG corresponds to the programming operation period of the fuse array included in the semiconductor memory device 310. The command signal CMD is generated from the controller 320. The command signal may be classified into "A" type and "B" type.

As shown in FIG. 4, when the programming period information INF_PRG has the logic high value, that is, when the fuse array performs the programming operation, the command signal CMD of "A" type is generated, and the command signal CMD of "B" type is generated during the other periods. The command signal CMD of "A" type does not relate to an operation for accessing the data programmed on the fuse array. The command signal CMD of "B" type relates to an operation for accessing the data programmed on the fuse array. For reference, the command signal CMD of "B" type may be an active operation or read/write operation.

That is, the controller 320 generates the command signal CMD of "A" type, which does not access the data programmed on the fuse array during the programming operation period, and generates the command signal CMD of "B" type, which accesses the data programmed on the fuse array when the programming operation is not performed.

The memory system in accordance with an embodiment of the present invention may enable the controller 320 to generate the command signal CMD having different types based on the programming period information INF_PRG.

Figure 5:
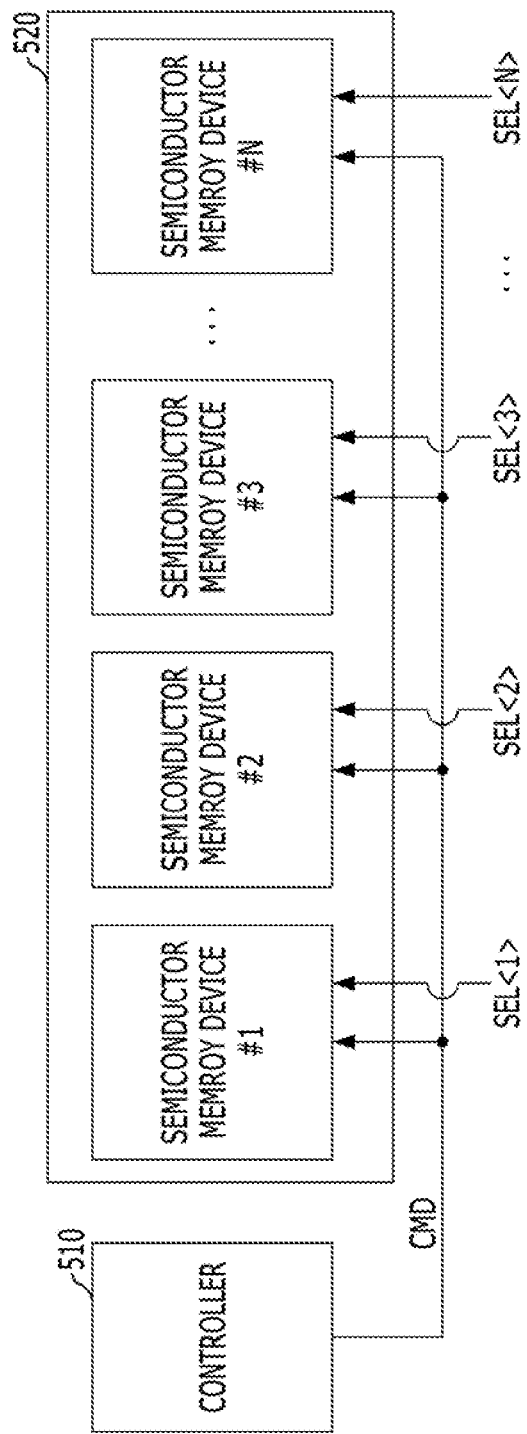
FIG. 5 is a block diagram illustrating a memory system in accordance with an embodiment of the present invention.

FIG. 5 is a block diagram illustrating a memory system in accordance with an embodiment of the present invention.

Referring to FIG. 5, the memory system may include a controller 510 and a memory module 520.

The controller 510 may generate a command signal CMD for controlling the memory module 520. The command signal CMD is provided to the memory module 520 through a transmission line, referred to as "a common transmission line".

The memory module 520 may be a dual in-line memory module (DIMM). For reference, the DIMM may share the command signal CMD, an address and a clock signal. The memory module 520 may include a plurality of semiconductor memory devices. The semiconductor memory devices receive the command signal CMD through the common transmission line, and perform various operations according to the command signal CMD. Each of the semiconductor memory devices may be selectively activated in response to selection signals SEL, respectively.

Hereinafter, an operation of the memory system will be described below. For the convenience, each of the semiconductor memory devices may include the configurations of the semiconductor memory device shown in FIG. 1.

It is presumed that the semiconductor memory devices perform the programming operation and the refresh operation in response to the command signal CMD. Moreover, it is presumed that the refresh operation is one of a plurality of operations for accessing the data programmed on the fuse array included in the semiconductor memory device.

First, the refresh operation of the semiconductor memory devices will be described.

The controller 510 may generate the command signal CMD corresponding to the refresh operation. The command signal CMD is transferred to the semiconductor memory devices through the common transmission line. The semiconductor memory devices perform the refresh operation in response to the command signal CMD.

Subsequently, the programming operation of the semiconductor memory devices will be described in detail.

One of the semiconductor memory devices to be programmed is enabled in response to a corresponding selection signal SEL, and the other semiconductor memory devices are disabled. Then, the controller 510 generates the command signal CMD corresponding to the programming operation, and transfers the command signal CMD to the corresponding semiconductor memory device. The corresponding semiconductor memory device performs the programming operation in response to the command signal CMD. The corresponding semiconductor memory device controls the input operation of the command signal CMD during the programming operation. This represents that the command signal CMD is not inputted during the programming operation.

The memory system in accordance with the embodiment of the present invention may control the input operation of the semiconductor memory device during the programming operation of the semiconductor memory device.

Figure 6:
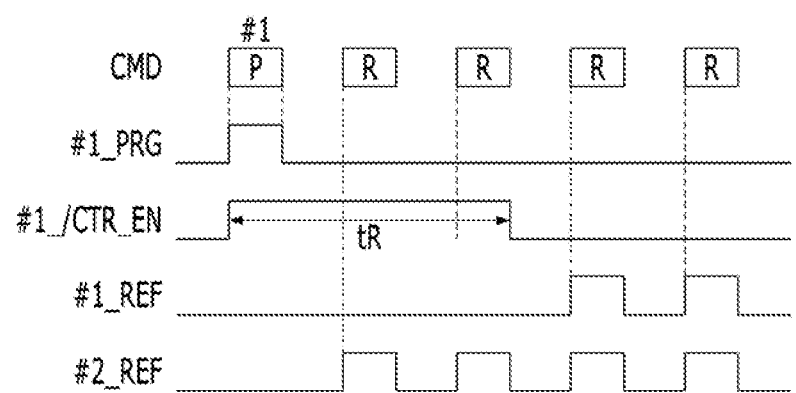
FIG. 6 is a timing diagram for describing an operation of the memory system shown in FIG. 5.

FIG. 6 is a timing diagram for describing an operation of the memory system shown in FIG. 5. For the convenience, two semiconductor memory devices will be described in detail.

Referring to FIGS. 5 and 6, if the programming operation of a first semiconductor memory device #1 is performed in response to the command signal CMD, the programming signal #1_PRG of the first semiconductor memory device #1 is enabled, and the programming operation is performed. The programming operation period is defined as "tR", and the enable control signal /CTR_EN has an activation width of "tR". Since the input operation of the command signal CMD is blocked during the period of the enable control signal having a logic high value, even though the command signal CMD corresponding to the refresh operation "R" is inputted, the refresh signal #1_REF as an internal command signal is not activated. However, since a second memory device #2 does not perform the programming operation, the input operation of the command signal CMD is not blocked. Thus, the second memory device #2 performs the refresh operation in response to the command signal CMD corresponding to the refresh operation during the programming operation of the first semiconductor memory device.

A memory system in accordance with an embodiment of the present invention enables the semiconductor memory devices included in the memory module 520 to perform the programming operation and the refresh operation at the sametime. Therefore, the semiconductor memory device performing the programming operation may improve the reliability of the data by blocking the input operation of the command signal CMD.

While the present invention has been described with respect to the specific embodiments, it will be apparent to those skilled in the art that various changes and modifications may be made without departing from the spirit and scope of the invention as defined in the following claims.

What is claimed is:

1. A memory system, comprising:
a semiconductor memory device suitable for programming predetermined data on a fuse array during a programming operation period, and accessing the programmed data during a normal operation; and
a controller suitable for receiving information corresponding to the programming operation period, and generating a command signal for the semiconductor memory device based on the information,
wherein the semiconductor memory device includes:
a command buffering unit suitable for receiving and buffering a command signal based on an enable control signal;
a fuse array suitable for programming data based on the command signal; and
an enable control unit suitable for generating the enable control signal, wherein an activation operation on the command buffering unit by the enable control signal is controlled during a programming operation period of the fuse array.

2. The memory system of claim 1, wherein the controller generates the command signal, which is not related to an access operation on the programmed data during the programming operation period.

3. The memory system of claim 2, wherein the controller generates the command signal corresponding to a refresh operation outside the programming operation period.

4. A memory system, comprising:
a controller suitable for transferring a command signal through a common transmission line; and
a plurality of semiconductor memory devices suitable for receiving the command signal, performing an operation corresponding to the command signal, programming predetermined data on a fuse array during a programming operation period, and accessing a programmed data during a normal operation,
wherein, when the programming operation is performed on at least one of the semiconductor memory devices, an input operation of the command signal is limited to the at least one of the semiconductor memory devices,
wherein each of the semiconductor memory devices includes:
a command buffering unit suitable for receiving and buffering a command signal based on an enable control signal;
a fuse array suitable for programming data based on the command signal; and
an enable control unit suitable for generating the enable control signal, wherein an activation operation on the command buffering unit by the enable control signal is controlled during a programming operation period of the fuse array.

5. The memory system of claim 4, wherein when the programming operation is performed on at least one of the semiconductor memory devices, the other semiconductor memory devices perform an operation other than the programming operation.

6. The memory system of claim 4, wherein the enable control unit adjusts an activation width of the enable control signal based on period information corresponding the programming operation period.

7. The memory system of claim 4, wherein the operation other than the programming operation, include an access operation on the programmed data.

8. The memory system of claim 7, wherein the operation other than the programming operation, include a refresh operation.

9. The memory system of claim 4, wherein the semiconductor memory devices are mounted on a module.

* * * * *